(12) United States Patent
Isham et al.

(10) Patent No.: US 9,991,792 B2
(45) Date of Patent: Jun. 5, 2018

(54) CURRENT SENSING WITH RDS$_{ON}$ CORRECTION

(71) Applicant: INTERSIL AMERICAS LLC, Milpitas, CA (US)

(72) Inventors: Robert H. Isham, Flemington, NJ (US); Thomas Hayes, Berkeley Heights, NJ (US); Andrew L. Webb, Hamilton, NJ (US); Julio Reyes, Leonia, NJ (US)

(73) Assignee: INTERSIL AMERICAS LLC, Milpitas, CA (US)

( * ) Notice: Subject to any disclaimer, the term of this patent is extended or adjusted under 35 U.S.C. 154(b) by 691 days.

(21) Appl. No.: 14/572,361

(22) Filed: Dec. 16, 2014

(65) Prior Publication Data
US 2016/0065067 A1 Mar. 3, 2016

Related U.S. Application Data

(60) Provisional application No. 62/042,521, filed on Aug. 27, 2014.

(51) Int. Cl.
*H02M 3/158* (2006.01)
*G01K 13/00* (2006.01)
(Continued)

(52) U.S. Cl.
CPC .......... *H02M 3/158* (2013.01); *G01K 13/00* (2013.01); *G01R 19/0092* (2013.01);
(Continued)

(58) Field of Classification Search
CPC ........... H02M 1/32; H02M 2001/0003; H02M 2001/0009; H02M 2001/327;
(Continued)

(56) References Cited

U.S. PATENT DOCUMENTS

6,246,220 B1 * 6/2001 Isham ................. H02M 3/1588
323/224
6,765,372 B2 7/2004 Isham
(Continued)

*Primary Examiner* — Emily P Pham
*Assistant Examiner* — Shahzeb K Ahmad
(74) *Attorney, Agent, or Firm* — Foley & Lardner LLP; Mark J. Danielson (57) ABSTRACT

Current sensing with RDS$_{ON}$ correction is disclosed. In an embodiment, a method comprises: measuring an approximate temperature of a MOS transistor switch by a temperature sensor to yield a measured temperature; calculating a corrected temperature from the measured temperature using a stored temperature sensor gain and offset correction function; measuring a gate drive voltage for the MOS transistor; calculating a voltage correction factor using a stored voltage correction function, wherein the stored voltage correction function is a function of the corrected temperature and the gate drive voltage; measuring a RDS$_{ON}$ voltage drop across the MOS transistor switch to yield a measured RDS$_{ON}$ voltage drop; and calculating the current using the measured RDS$_{ON}$ drop and the voltage correction factor.

20 Claims, 7 Drawing Sheets

(51) Int. Cl.
*G01R 19/00* (2006.01)
*G01R 35/00* (2006.01)
*H02M 1/32* (2007.01)
*H02M 1/00* (2006.01)

(52) U.S. Cl.
CPC ............. *G01R 35/005* (2013.01); *H02M 1/32* (2013.01); *H02M 2001/0009* (2013.01)

(58) Field of Classification Search
CPC ...... H02M 3/156; H02M 3/157; H02M 3/158; H02M 3/335; H02M 3/337; G01R 19/32; G05F 1/463
See application file for complete search history.

(56) References Cited

U.S. PATENT DOCUMENTS

| | | |
|---|---|---|
| 6,812,677 B2 | 11/2004 | Walters et al. |
| 7,589,514 B1 | 9/2009 | Fernald |
| 7,960,951 B2 | 6/2011 | Southwell et al. |
| 8,729,955 B2 | 5/2014 | Nien et al. |
| 9,124,231 B2 * | 9/2015 | Shi ..................... H03G 1/0005 |
| 2009/0051307 A1 * | 2/2009 | Katsuyama ............. H02M 1/32 |
| | | 318/472 |
| 2013/0257517 A1 * | 10/2013 | Kawashima ........... G01R 19/32 |
| | | 327/513 |
| 2015/0130476 A1 * | 5/2015 | Takahashi ............... H02M 1/32 |
| | | 324/537 |

\* cited by examiner

CURRENT SENSING WITH RDS$_{ON}$ CORRECTION

CROSS-REFERENCE TO RELATED APPLICATIONS

This application claims priority to U.S. provisional patent application Ser. No. 62/042,521, entitled "METHOD OF ACCURATELY REPORTING CURRENT AS MEASURED BY A METAL-OXIDE SEMICONDUCTOR (MOS) ON-STATE RESISTANCE (RDS$_{ON}$) VOLTAGE DROP," filed on Aug. 27, 2014, which is incorporated herein by reference.

DRAWINGS

Understanding that the drawings depict only exemplary embodiments and are not therefore to be considered limiting in scope, the exemplary embodiments will be described with additional specificity and detail through the use of the accompanying drawings, in which.

In accordance with common practice, the various described features are not drawn to scale but are drawn to emphasize specific features relevant to the exemplary embodiments.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made. Furthermore, the method presented in the drawing figures and the specification is not to be construed as limiting the order in which the individual steps may be performed.

DC-to-DC voltage conversion can be performed by a switching power supply that converts a voltage (e.g. 12V) to a different voltage, as required by one or more load devices. Switching power supplies usually include a current sensing mechanism for various purposes, including, but not limited to, control loop inputs (current mode control), over current detection, multi-phase converter inductor current balance, output current reporting, and input current reporting. One technique for determining the current in a switching power supply is to measure the RDS$_{ON}$ voltage drop of the switches that are turned on and off to produce the output voltage of the switching power supply. If the RDS$_{ON}$ of the switch is known and the on-state voltage drop is measured, the current through the switch can be determined according to Ohm's Law, V=I*R. However, the RDS$_{ON}$ of the switch is not easily known because it is not constant; the RDS$_{ON}$ is a function of the device characteristics, gate drive voltage, and temperature. In many conventional implementations, the RDS$_{ON}$ variability is not accounted for; and therefore, the current through the switch cannot be accurately calculated.

System Including a Driver with RDS$_{ON}$ Correction

Figure 1:
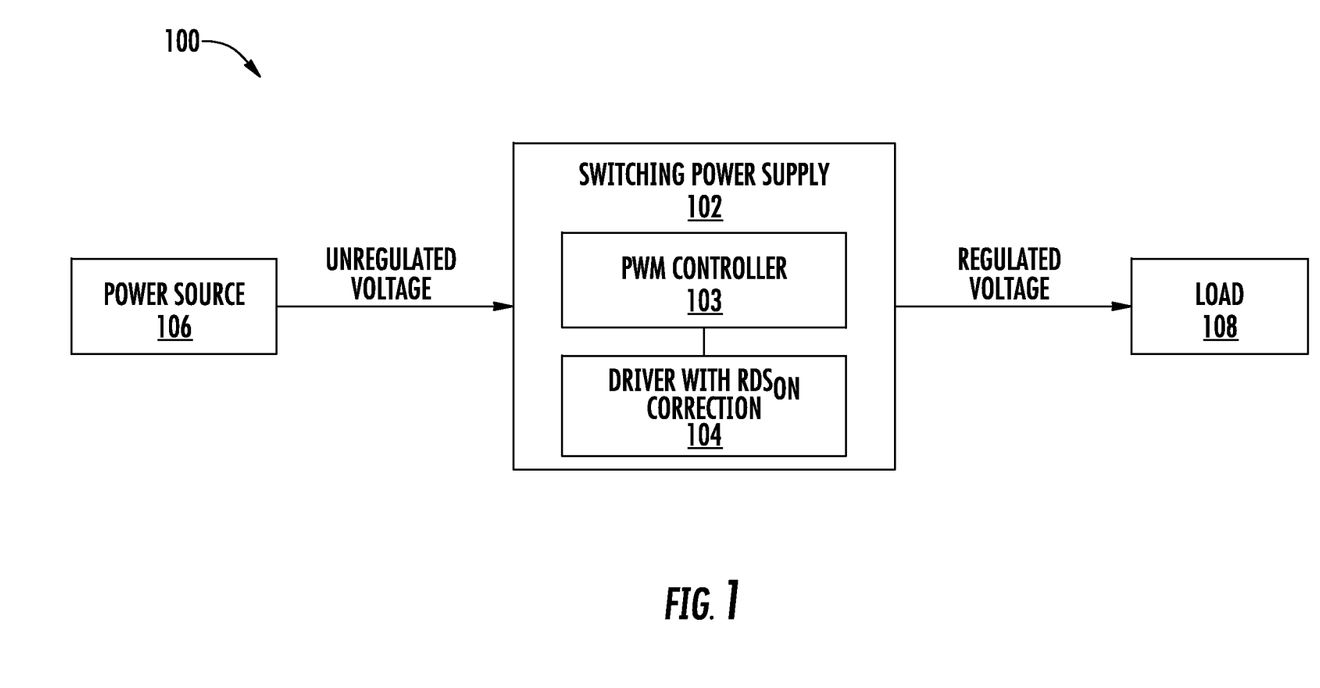
FIG. 1 is a block diagram of an exemplary system that includes a driver with on-state resistance (RDS$_{ON}$) correction.

FIG. 1 is a block diagram of an exemplary system 100 that includes a driver with RDS$_{ON}$ correction 104 and a pulse width modulation (PWM) controller 103. As explained below, the PWM controller 103 sends control signals to the driver with RDS$_{ON}$ correction 104. In some embodiments, the PWM controller 103 and the driver with RDS$_{ON}$ correction 104 can be included in the same chip. In other embodiments, the PWM controller 103 and the driver with RDS$_{ON}$ correction 104 are on different chips.

The driver with RDS$_{ON}$ correction 104 can be used to accurately report the current flow through a metal-oxide-semiconductor (MOS) transistor switch that is used in a switching power supply 102 to control the output voltage of the switching power supply 102. In some embodiments, the MOS transistor switch can be an n-channel MOS (NMOS) transistor switch, a p-channel MOS (PMOS) transistor switch, a complementary MOS (CMOS) transistor switch, or double-diffusion (DMOS) transistor switch. The driver with RDS$_{ON}$ correction 104 can be implemented as one or more of the RDS$_{ON}$ correction circuits discussed in the embodiments below. The switching power supply 102 can be included in any suitable electronic device using regulated power including, but not limited to, a desktop computer, a laptop computer, or tablet computer, a set-top box, battery charger, or other device.

The system 100 also includes a power source 106 and a load 108. The load 108 draws power from the power source 106 via the switching power supply 102. The switching power supply 102 can receive unregulated voltage from the power source 106 (e.g., line power, battery power), regulate the voltage, and provide regulated supply voltage to the load 108. The load 108 can include, but is not limited to, one or more processors (e.g., a central processing unit (CPU), a microcontroller, microprocessor, a field programmable gate array (FPGA), an application specific integrated circuit (ASIC), etc.), a display device (e.g., a light-emitting diode (LED) display, a liquid crystal display (LCD), a cathode ray tube (CRT) display, etc.), a memory device (e.g., a conventional hard disk, a volatile or non-volatile media such as a solid state hard drive, random access memory (RAM) including, but not limited to, synchronous dynamic random access memory (SDRAM), double data rate (DDR) RAM, RAMBUS dynamic RAM (RDRAM), static RAM (SRAM), etc.), electrically erasable programmable ROM (EEPROM), and flash memory, etc.), other peripheral devices, an internal device component, or other components.

Switching Power Supply Including a Driver with RDS$_{ON}$ Correction

Figure 2:
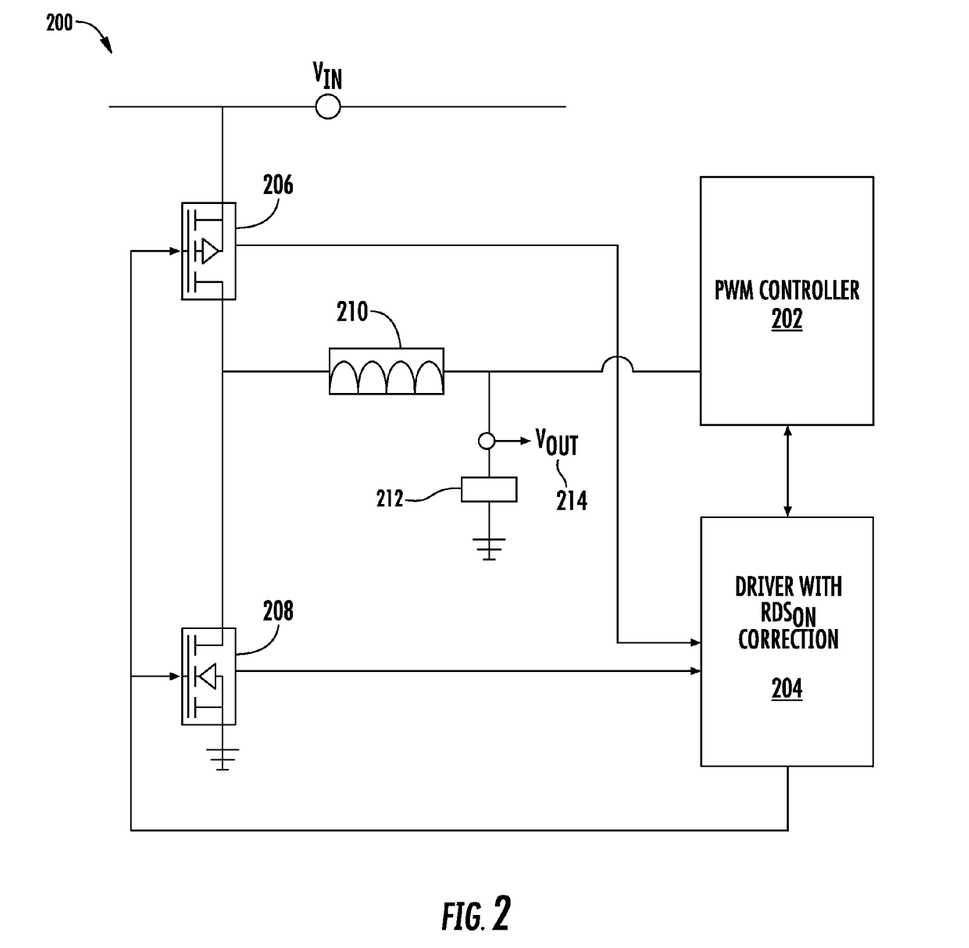
FIG. 2 is a diagram of an exemplary switching power supply that includes a driver with RDS$_{ON}$ correction.

FIG. 2 is a diagram of an exemplary switching power supply 200 that includes a driver with RDS$_{ON}$ correction 204. While only a single-phase switching power supply 200 is shown, in some embodiments, multi-phase switching power supplies 200 can be used as well. As stated above, the switching power supply 200 includes a pulse-width modulation (PWM) controller 202 that sends control signals to the driver with RDS$_{ON}$ correction 204. In response to the control signals sent by the PWM controller 202, the driver with RDS$_{ON}$ correction 204 drives the gates of the MOS transistor switches 206, 208. The switching of the MOS transistor switches 206, 208 produce a square-wave. The square-wave can be smoothed using an LC circuit comprising an inductor 210 and a capacitor 212 to produce the desired voltage, $V_{out}$ 214. $V_{out}$ 214 can also be digitized and fed in the PWM controller 202. Depending on the desired $V_{out}$ 214, the PWM controller 202 can maintain or vary the control pulses sent to the driver with $RDS_{ON}$ correction 204, which drive the MOS transistor switches 206, 208. In exemplary embodiments, MOS transistor switch 206 is a p-channel MOS; however, in other embodiments, MOS transistor switch 206 can be other types of MOSs. In the simplified block diagram of the exemplary power supply shown in FIG. 2, the gates of MOS transistor switches 206 and 208 are connected together. In other embodiments, the driver with $RDS_{ON}$ correction 204 may include two separate gate drivers driving the gates of MOS transistor switches 206 and 208 separately and individually.

In addition to driving the gates of the MOS transistor switches 206, 208, the driver with $RDS_{ON}$ correction 204 can calculate the current through each of the MOS transistor switches 206, 208. As mentioned above, in order to do so accurately, the device characteristics and temperature dependency of the $RDS_{ON}$ of the MOS transistor switches 206, 208 must be calculated. The driver with $RDS_{ON}$ correction 204 accomplishes this, in one embodiment, as explained in FIGS. 3A-3B.

Driver with $RDS_{ON}$ Correction

Figure 3A:
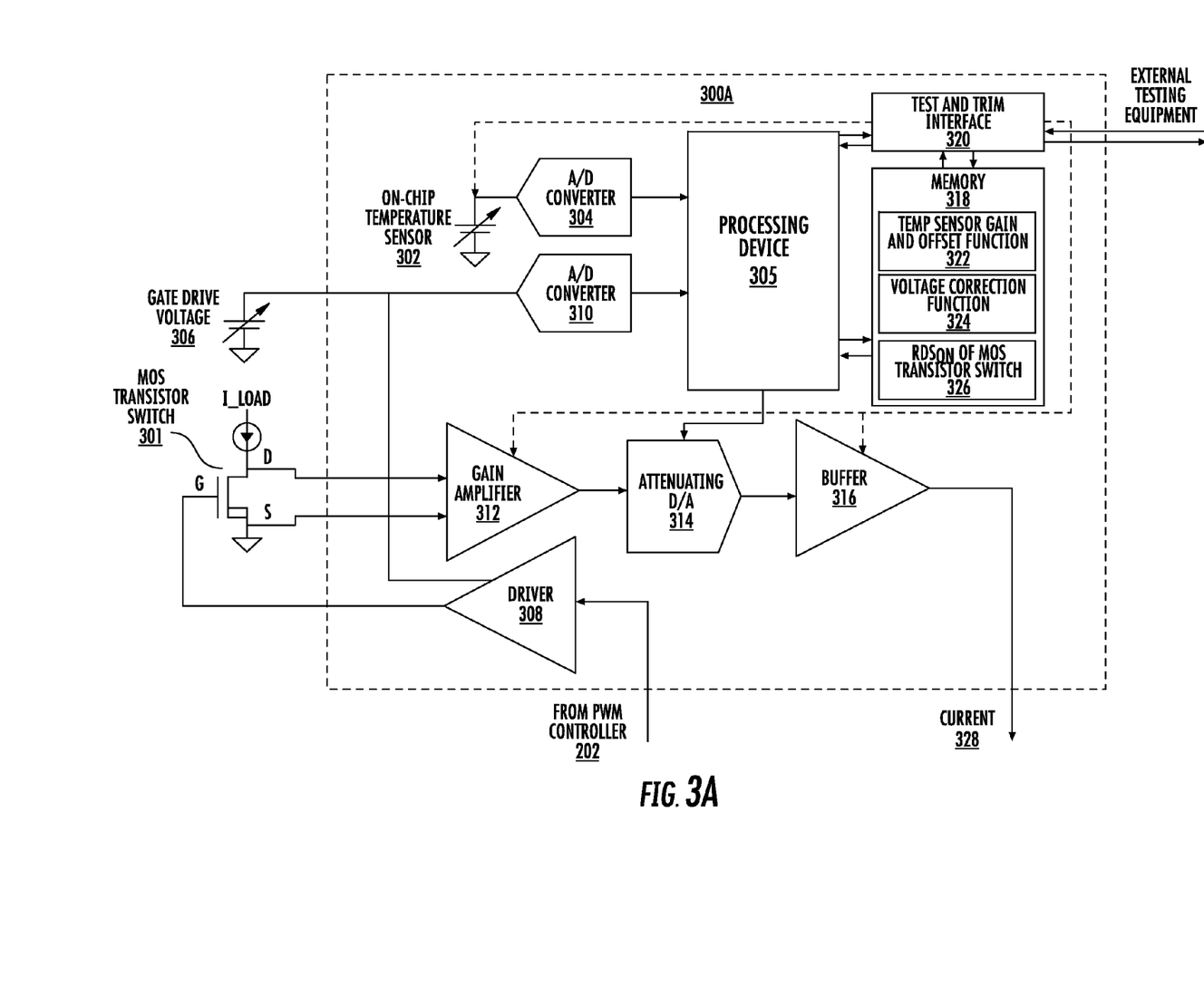
FIGS. 3A-3B are diagrams of exemplary drivers with RDS$_{ON}$ correction.
Figure 3B:
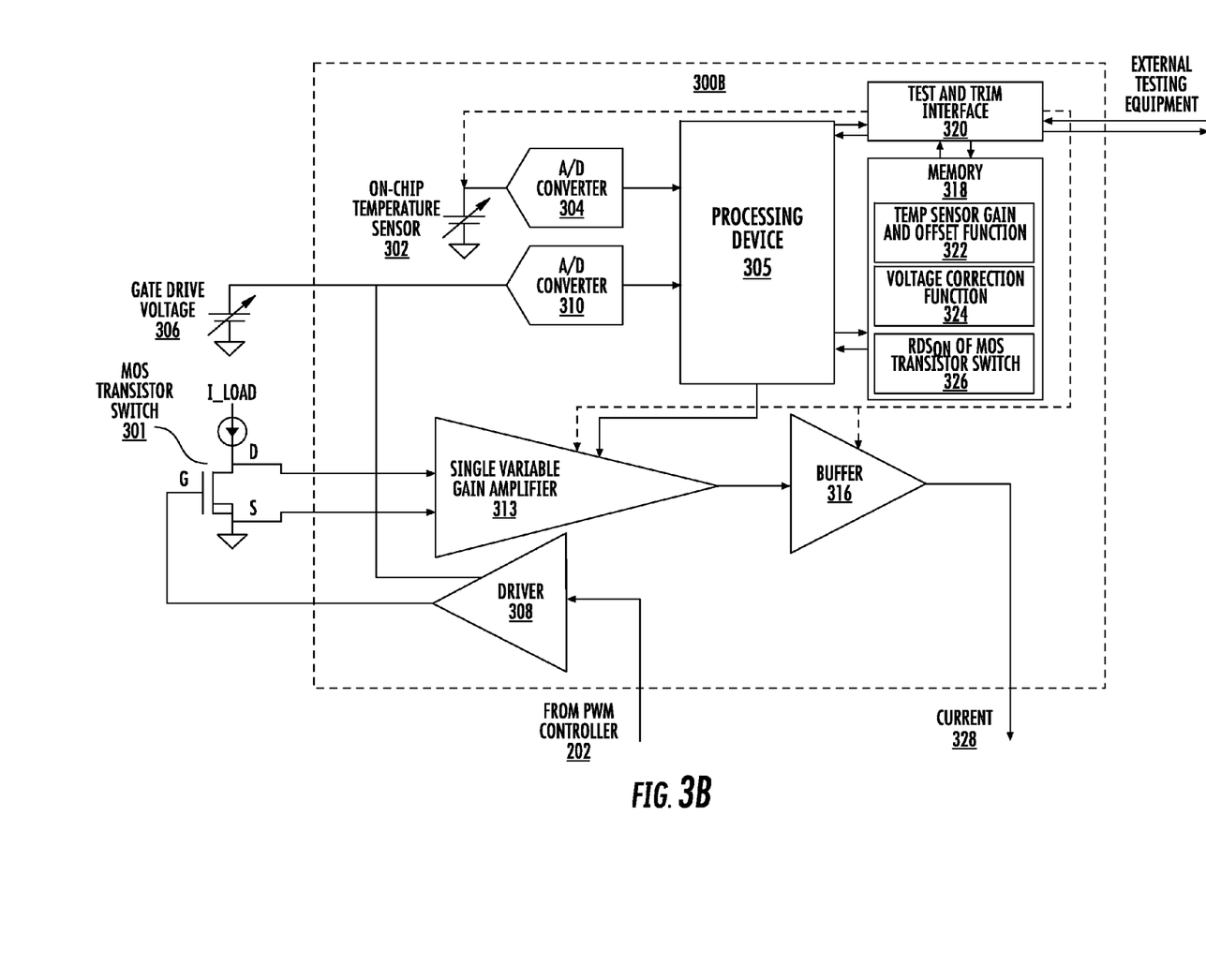

FIGS. 3A-3B are diagrams of exemplary drivers with $RDS_{ON}$ correction 300A, 300B. FIG. 3A differs from FIG. 3B only insofar as FIG. 3B includes a single variable gain amplifier 313, instead of two distinct circuit elements, a gain amplifier 312 and attenuating D/A 314, as discussed below. The MOS transistor switch 301 is not included in the driver with $RDS_{ON}$ correction 300A, 300B; however, it is shown in FIGS. 3A and 3B to better explain how the current of MOS transistor switch 301 is measured and how it is coupled to the driver with $RDS_{ON}$ correction 300A, 300B. The MOS transistor switch 301 can be either of the MOS transistor switches 206, 208 shown in FIG. 2. The components of the driver with $RDS_{ON}$ correction 300A, 300B will be discussed first, followed by how the driver with $RDS_{ON}$ correction 300A, 300B calculates the on-state resistance ($RDS_{ON}$) of MOS transistor switch 301 from which the current through the MOS transistor switch 301 can be derived.

Components of the Driver with $RDS_{ON}$ Correction

The driver with $RDS_{ON}$ correction 300A, 300B includes an on-chip temperature sensor 302. The on-chip temperature sensor 302 is configured so that the on-chip temperature sensor 302 outputs an analog voltage proportional to a temperature that is sufficiently similar to the temperature of the MOS transistor switch 301. The temperature measured by the on-chip temperature sensor is referred to herein as the measured temperature, the on-chip temperature sensor reading or the measured temperature signal. In exemplary embodiments, the on-chip temperature sensor 302 can be thermally coupled to the MOS transistor switch 301 for which the current will be measured. The analog voltage is converted to a digital voltage by an analog-to-digital (A/D) converter 304.

The driver with $RDS_{ON}$ correction 300A, 300B also includes a processing device 305 and the digital representation of the analog voltage is sent to a processing device 305. The gate drive voltage 306 that is supplied to the gate driver 308 (which drives the gate of the MOS transistor switch 301) is also converted to a digital signal using an A/D converter 310 and sent to the processing device 305. The gate driver 308 that drives the MOS transistor switch 301 is controlled by the PWM controller 202 as explained above in FIG. 2. The processing device 305 can include functions with software programs, firmware, or other computer readable instructions for carrying out various process tasks, calculations, and control functions used in the present disclosure and may be supplemented by, or incorporated in, specially-designed application-specific integrated circuits (ASICs) or field programmable gate arrays (FPGAs).

The driver with $RDS_{ON}$ correction 300A, 300B also includes memory 318 for storing correction functions 322, 324, as discussed below. The memory used in the present disclosure can be any appropriate tangible and non-transitory processor readable medium used for storage of processor readable instructions or data structures. Suitable memory can include, but is not limited to, fuses, zener zap diodes, or erasable or non-erasable programmable read-only memory.

The driver with $RDS_{ON}$ correction 300A, 300B includes a test and trim interface 320 that is used to communicate between external testing equipment (not shown) and the internal circuitry of the driver with $RDS_{ON}$ correction 300A, 300B. The test and trim interface 320 can also be used for conventional trims such as amplifier offsets for the gain amplifier 312 and the buffer 316.

Furthermore, the driver with $RDS_{ON}$ correction 300A includes a gain amplifier 312 to amplify a measured $RDS_{ON}$ voltage drop across the MOS transistor switch 301. The output of the gain amplifier 312 is attenuated by an attenuating digital-to-analog (D/A) converter 314, as determined by the processing device 305 and the voltage correction function 324, in order to obtain a corrected $RDS_{ON}$ voltage drop across the MOS transistor switch 301, as explained in more detail below. In some embodiments, the signal from the attenuating D/A converter 314 can be buffered using a buffer 316 if the corrected $RDS_{ON}$ voltage drop is used outside the driver with $RDS_{ON}$ correction 300A, 300B. Moreover, in some embodiments, a sample and hold circuit element (not shown) can be added between the gain amplifier 312 and the attenuating D/A converter 314 or between D/A 314 and the buffer 316 if it is desirable to remember the measured $RDS_{ON}$ voltage drop or the corrected $RDS_{ON}$ voltage drop while the MOS transistor switch 301 is off. It will be appreciated by those of ordinary skill in the art that different arrangements of the amplifier 312 and the attenuating D/A converter 314 may be used; moreover, the amplifier 312 and the attenuating D/A converter 314 can be merged into a single variable gain amplifier 313 with the gain set to the correct output, as shown in FIG. 3B.

Calibration and Operation of the Driver with $RDS_{ON}$ Correction

As explained above, the current through a MOS transistor switch 301 can be accurately determined from its $RDS_{ON}$ voltage drop if the on-state resistance ($RDS_{ON}$) is known. However, the $RDS_{ON}$ is a function of the device characteristics, temperature and gate drive voltage ($V_{gs}$) 306. Therefore, the $RDS_{ON}$ as a function of temperature must be calibrated. To do so, the driver with $RDS_{ON}$ correction 300A, 300B can be calibrated as follows.

Temperature Sensor Gain and Offset Correction Function Calibration

In exemplary embodiments, the driver with $RDS_{ON}$ correction 300A, 300B is tested at two or more temperatures, $T_1$ and $T_2$. In exemplary embodiments, $T_1$ and $T_2$ are chosen at opposite ends of the working temperature range of the switching power supply 102 or the automatic test equipment (ATE) that is aiding the calibration, whichever is more restrictive. A wide separation in $T_1$ and $T_2$ may improve the accuracy of the driver with $RDS_{ON}$ correction 300A, 300B. At $T_1$, the on-chip temperature sensor 302 is read and stored in memory 318, which will be referred to as $T_{original}$. Moreover, the actual chip temperature as measured by the external testing equipment is stored in memory 318, via the test and trim interface 320. The actual chip temperature as measured by external testing equipment will be referred to as $T_{actual}$. At $T_2$, this process is repeated. Next, by comparing $T_{original}$ and $T_{actual}$ at both $T_1$ and $T_2$, either the processing device 305 or external testing equipment can calculate a temperature sensor gain and offset correction function 322 for the on-chip temperature sensor 302 by fitting a regression function to the data. In some embodiments, the regression function can be linear; or, in some embodiments, the regression function can be higher order. After the temperature sensor gain and offset correction function 322 is determined, it can be stored in memory 318.

Furthermore, in some embodiments, the temperature sensor gain and offset correction function 322 can be extrapolated outside $T_1$ and $T_2$, so that a corrected temperature can be determined outside $T_1$ and $T_2$. Thus, at any temperature, the processing device 305 can read a measured temperature from the on-chip temperature sensor 302 and apply a temperature gain factor to the measured temperature to yield a corrected temperature.

Correcting a Measured Temperature

This temperature sensor gain and offset correction function 322 can be retrieved from memory 318 and applied by processing device 305 to the measured temperature signal produced by the on-chip temperature sensor 302, which will yield a corrected temperature, for any operation requiring an accurate chip temperature reading from the on-chip temperature sensor 302. In some exemplary embodiments, the processing device 305 applies the temperature sensor gain and offset correction function 322 by multiplying the measured temperature signal produced by the on-chip temperature sensor 302 by a temperature gain factor to yield a product and adding a temperature offset factor to the product to yield the corrected temperature, wherein the temperature gain factor and the temperature offset factor are determined according to the temperature sensor gain and offset correction function 322 and the measured temperature. In other exemplary embodiments, the processing device 305 applies the temperature sensor gain and offset correction function 322 by adding a temperature offset factor to the measured temperature to yield a sum and multiplying the sum by a temperature gain factor to yield the corrected temperature, wherein the temperature gain factor and the temperature offset factor are determined according to the temperature sensor gain and offset correction function 322 and the measured temperature. That is, the order for which the temperature offset factor and the temperature gain factor are applied is determined according the temperature gain and offset correction function 322 and can be reversed. As an example, assume the on-chip temperature sensor 302 produces a measured temperature signal of 50 degrees Celsius. The processing device 305 will retrieve the temperature sensor gain and offset correction function 322 from memory 318 and determine at 50 degrees Celsius that the measured temperature needs to be multiplied by a 0.98 temperature gain factor to yield a product and a 4 degree temperature offset factor added to the product. After the temperature gain factor and the temperature offset factor are applied to the measured temperature (50 degrees Celsius), a corrected temperature of 53 degrees Celsius is rendered.

Voltage Correction Function Calibration

Furthermore, at $T_1$, a calibrated current can be sent through the MOS transistor switch 301 and the resulting voltage read at the buffer 316. In some embodiments, the calibrating current can be sent by external testing equipment. After which, the voltage correction function 324 at $T_1$ can be calculated (by either the processing device 305 or by external testing equipment) by comparing the voltage drop that should have been read at the buffer 316 (referred to as the theoretical $RDS_{ON}$ voltage drop) and the voltage drop that was actually read at the buffer 316 (referred to as the measured $RDS_{ON}$ voltage drop), as a function of the known calibration current that was passed through the MOS transistor switch 301. This calculated voltage correction function 324 can be stored in memory 318 and can be applied by the attenuating D/A converter 314 so that the correct theoretical voltage is measured at buffer 316 at temperature $T_1$. Similarly, this process can be repeated at $T_2$ and the voltage correction function 324 at $T_2$ can be stored in memory 324, as well. After the temperature sensor gain and offset correction function 322 and the voltage correction function 324 are calculated at $T_1$ and $T_2$, either the processing device 305 or external testing equipment can extrapolate the voltage correction function 324 as a function of temperature, by fitting a regression function to the data points, and this voltage correction function 324 can be stored in memory 318. Since the difference between the theoretical $RDS_{ON}$ voltage drop and the measured $RDS_{ON}$ voltage drop MOS transistor switch 301 is known at different temperatures when a calibrating current is passing through the MOS transistor switch 301, the $RDS_{ON}$ 326 of the MOS transistor switch 301 can be calculated using Ohm's Law, V=I*R for a given temperature. The $RDS_{ON}$ 326 of the MOS transistor switch 301 can be stored in memory and can be used in the future to determine the current through the MOS transistor switch 301 when $RDS_{ON}$ voltage drop of the MOS transistor switch 301 is measured, according to Ohm's Law.

In most embodiments, the MOS transistor switch 301 $RDS_{ON}$ varies with the gate drive voltage 306 as well as temperature. As a result, the above calculations for the attenuation values 324 and $RDS_{ON}$ correction 326 can also be done using different gate drive voltages 306. In these embodiments, four or more calibration points can then be used in these embodiments to determine the attenuation values 324 from which the $RDS_{ON}$ correction 326 can be derived. For example, a first calibration point can be at $T_1$ with a low drive supply voltage, a second calibration point can be at $T_1$ with a high drive supply voltage, a third calibration point can be at $T_2$ with a low drive supply voltage and a fourth calibration point can be at $T_2$ with a high drive supply voltage. The processing device 305 or external testing equipment can then interpolate the relationship between the temperature sensor gain and offset correction function 322 and the attenuation values 324 for both sets of conditions. In some embodiments, if the voltage dependency is small enough, a linear adjustment to $RDS_{ON}$ versus the temperature dependent gate drive voltage 306 may suffice or ignored completely.

Similarly to the temperature sensor gain and offset correction function 322, in some embodiments, the voltage correction function 324 can be extrapolated outside $T_1$ and $T_2$, so that a corrected temperature and corrected $RDS_{ON}$ voltage drop can be determined outside $T_1$ and $T_2$. Thus, at any temperature, the processing device 305 can read a measured temperature from the on-chip temperature sensor 302 and apply a temperature gain factor to the measured temperature to yield a corrected temperature, retrieve the stored relationship between the corrected temperature and a gate drive voltage, and determine the proper attenuation to be applied by the attenuating D/A converter 314 to a measured $RDS_{ON}$ voltage drop.

In some embodiments, the MOS transistor switch 301 can have a linear, $2^{nd}$ order or piecewise linear relationship between $RDS_{ON}$ and temperature. This can be determined by characterizing samples of the MOS transistor switch 301 over the desired temperature range. If the MOS transistor switch 301 does not have a linear $RDS_{ON}$ versus temperature characteristic, then a $2^{nd}$ order equation could be processed by the processing device 305. In some embodiments, the MOS transistor switch 301 might be found to have a variable shape to its $RDS_{ON}$ versus temperature curve. In these embodiments, a $3^{rd}$ order or more necessary $RDS_{ON}$ measurement can be made and a piecewise linear or variable $2^{nd}$ order equation can be used.

Correcting a Measured $RDS_{ON}$ Voltage Drop

At any temperature from $T_1$ to $T_2$, processing device 305 can receive a measured temperature signal from the on-chip temperature sensor 302, and calculate a corrected temperature from the measured temperature signal using the temperature sensor gain and offset correction function 322, as described above. Then, processing device 305 can use the corrected temperature, retrieve the voltage correction function 324 and receive a gate drive voltage 306 to calculate a voltage correction factor using voltage correction function 324. The voltage correction factor is the overall correction gain that is applied to a measured $RDS_{ON}$ voltage drop yield a correction $RDS_{ON}$ voltage drop. In exemplary embodiments, a corrected $RDS_{ON}$ voltage drop can be calculated from the measured $RDS_{ON}$ voltage drop by multiplying the measured $RDS_{ON}$ voltage drop by the voltage correction factor to yield a corrected $RDS_{ON}$ voltage drop, wherein the voltage correction factor is determined according to the voltage correction function 324. The attenuating D/A converter 314 can be used to multiply the $RDS_{ON}$ voltage drop measured by the gain amplifier 312 by the voltage correction factor. As a result, the corrected $RDS_{ON}$ voltage drop is measured at the buffer 316 for any temperature between $T_1$ and $T_2$. For example, assume the gate drive voltage 306 is 5 V and the corrected temperature is 50 degrees Celsius. The processing device 305 will retrieve the voltage correction function 322 from memory 318 and determine that at 50 degrees Celsius with a gate drive voltage of 5V, that the measured $RDS_{ON}$ voltage drop needs to be multiplied by a 0.98 voltage correction factor. After this voltage correction factor is applied to the measured $RDS_{ON}$ voltage drop of 50 mV, a corrected $RDS_{ON}$ voltage drop of 49 mV is rendered. Using the corrected $RDS_{ON}$ voltage drop, a current 328 through the MOS transistor switch 301 can be determined, as described above, for use in the various applications mentioned above.

Method for Sensing Current with $RDS_{ON}$ Correction

Figure 4:
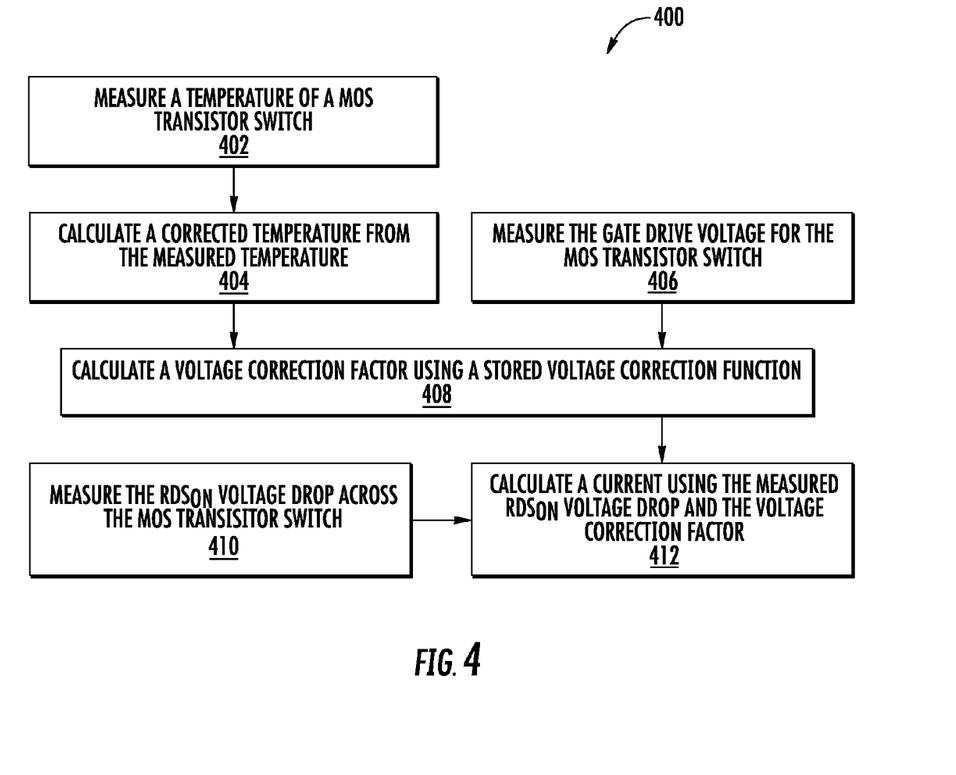
FIG. 4 is a flow diagram of an exemplary method for determining a current.

FIG. 4 is a flow diagram of an exemplary method 400 for determining a current with $RDS_{ON}$ correction. Method 400 comprises measuring an approximate temperature of a MOS transistor switch by a temperature sensor to yield a measured temperature (block 402). After which, method 400 further comprises calculating a corrected temperature from the measured temperature using a stored temperature sensor gain and offset correction function (block 404). In some exemplary embodiments, calculating a corrected temperature from the measured temperature comprises multiplying the measured temperature by a temperature gain factor to yield a product and adding a temperature offset factor to the product to yield the corrected temperature, wherein the temperature gain factor and the temperature offset factor are determined using the stored temperature sensor gain and offset correction function and the measured temperature. In other exemplary embodiments, calculating a corrected temperature from the measured temperature comprises adding a temperature gain factor to the measured temperature to yield a sum and multiplying the sum by a temperature gain factor to measured to yield the corrected temperature, wherein the temperature gain factor and the temperature offset factor are determined using the stored temperature sensor gain and offset correction function and the measured temperature. In exemplary embodiments, the temperature sensor gain and offset correction function can have some or all of the same characteristics as the temperature sensor gain and offset correction function 322 above. For example, the temperature sensor gain and offset correction function could have been determined using a regression fit function during a calibration process, as explained in FIG. 5 below. Moreover, in some embodiments, the regression fit function is a linear regression fit function.

Method 400 further comprises measuring the gate drive voltage for the MOS transistor switch (block 406). As stated above, the gate drive voltage is a factor in calculating the $RDS_{ON}$ of the MOS; therefore, the gate drive voltage for the MOS is measured and known.

Method 400 further comprises calculating a voltage correction factor using a stored voltage correction function, wherein the stored voltage correction function is a function of the corrected temperature and the gate drive voltage (block 408). In exemplary embodiments, the voltage correction function and the voltage correction factor can have some or all of the same characteristics as the voltage correction function 324 and the voltage correction factor discussed above. For example, the voltage correction function could have been determined using a regression fit function during a calibration process, as explained in FIG. 6 below. Moreover, in some embodiments, the regression fit function is a linear regression fit function.

Method 400 further comprises measuring a $RDS_{ON}$ voltage drop across the MOS transistor switch to yield a measured voltage drop (block 410). The $RDS_{ON}$ voltage drop across the MOS transistor switch can be measured using any of the embodiments described above. For example, in some embodiments, an amplifier can be coupled to the MOS transistor switch to measure the $RDS_{ON}$ voltage drop across the MOS transistor switch.

Method 400 further comprises calculating a current using the measured $RDS_{ON}$ voltage drop and the voltage correction function (block 412). In exemplary embodiments, the current can be calculated by multiplying the measured $RDS_{ON}$ voltage drop by the voltage correction function to yield a corrected $RDS_{ON}$ voltage drop. The current can then be determined from the corrected $RDS_{ON}$ voltage drop according to V=I*R and as described above (block 412). As described above, this current can be used for many purposes in DC-to-DC voltage conversion, including, but not limited

Figure 5:
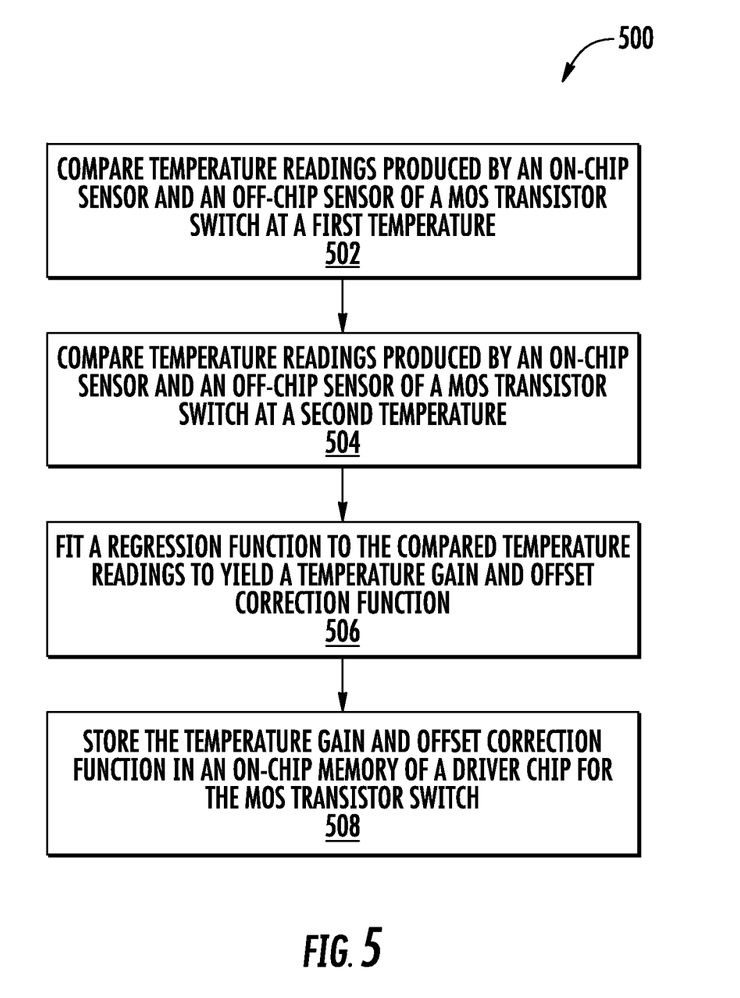
FIG. 5 is a flow diagram of an exemplary method for determining a temperature sensor gain and offset correction function.

Method for Determining a Temperature Sensor Gain and Offset Correction Function FIG. 5 is a flow diagram of an exemplary method 500 for determining a temperature sensor gain and offset correction function. Method 500 comprises comparing a first on-chip temperature sensor reading of a MOS transistor switch with a first off-chip temperature sensor reading of a MOS transistor switch at a first temperature (block 502) and comparing a second on-chip temperature sensor reading of a MOS transistor switch with a second off-chip temperature sensor reading of a MOS transistor switch at a second temperature (block 504). The devices and circuit elements used to measure off-chip temperature and the on-chip temperature, respectively, can have some or all of the same characteristics as described above in FIGS. 3A-3B.

Method 500 further comprises fitting a regression function that corresponds to the temperature sensor gain and offset correction function using at least the comparison of the first on-chip temperature sensor reading with the first off-chip temperature sensor reading and at least the comparison of the second on-chip temperature sensor reading with the second off-chip temperature sensor reading (block 506). In some embodiments, the regression fit function can be a linear regression function and in other embodiments the regression function can be higher order. After which, method 500 further comprises storing the regression function in an on-chip memory of a driver chip for the MOS transistor switch (block 508).

Method for Determining a Voltage Correction Function

Figure 6:
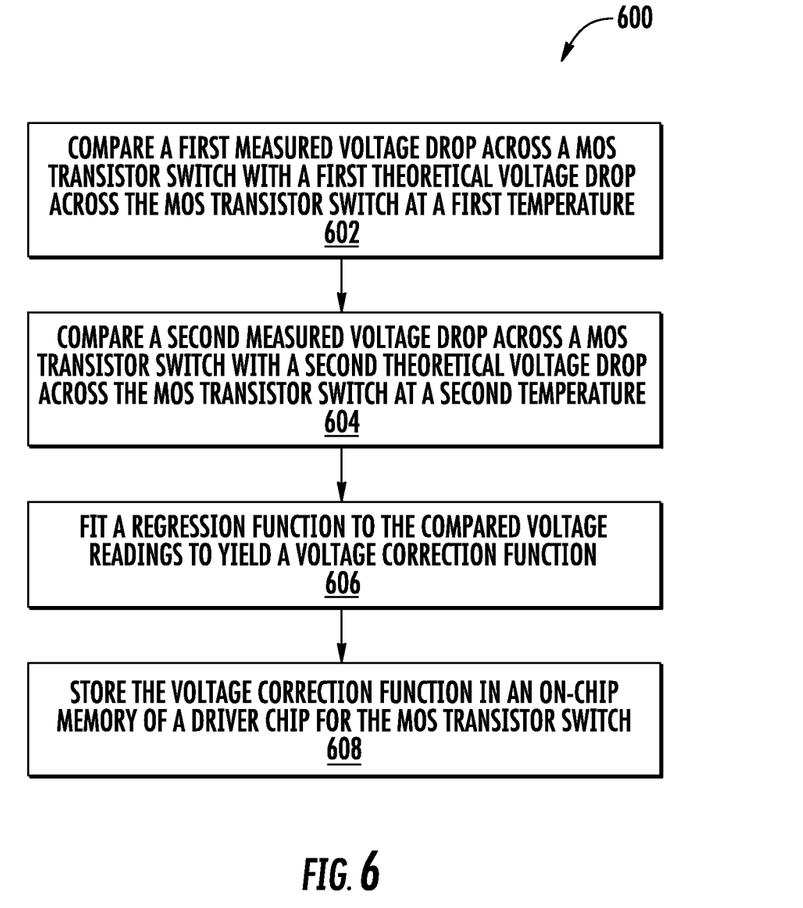
FIG. 6 is a flow diagram of an exemplary method for determining a voltage correction function.

FIG. 6 is a flow diagram of an exemplary method for determining a voltage correction function. Method 600 comprises comparing a first measured $RDS_{ON}$ voltage drop across a MOS transistor switch when a calibrating current is passing through the MOS transistor switch with a first theoretical $RDS_{ON}$ voltage drop across the MOS transistor switch at a first temperature (block 602) and comparing a second measured $RDS_{ON}$ voltage drop across the MOS transistor switch when a calibrating current is passing through the MOS transistor switch with a second theoretical $RDS_{ON}$ voltage drop across the MOS transistor switch at a second temperature (block 604). The devices and circuit elements used to produce the calibrating current and to measure the $RDS_{ON}$ voltage drop across the MOS transistor switch, respectively, can have some or all of the same characteristics as described above.

Method 600 further comprises fitting a regression function that corresponds to the voltage correction function using at least the comparison of the first measured $RDS_{ON}$ voltage drop with the first theoretical $RDS_{ON}$ voltage drop and at least the comparison of the second measured $RDS_{ON}$ voltage drop with the second theoretical $RDS_{ON}$ voltage drop (block 606). In some embodiments, the regression fit function can be a linear regression function and in other embodiments the regression function can be higher order.

The above measurements can be repeated at different gate drive voltages at different temperatures to determine the relationship between the gate drive voltage, temperature and a $RDS_{ON}$ measured voltage drop. More specifically, method 600 can include comparing a third measured $RDS_{ON}$ voltage drop across the MOS transistor switch when a calibrating current is passing through the MOS transistor switch with a third theoretical $RDS_{ON}$ voltage drop across the MOS transistor switch at the first temperature, wherein the third theoretical $RDS_{ON}$ voltage drop is different than the first theoretical $RDS_{ON}$ voltage drop. Thereafter, the regression function can use the comparison of the first measured $RDS_{ON}$ voltage drop with the first theoretical $RDS_{ON}$ voltage drop, the comparison of the second measured $RDS_{ON}$ voltage drop with the second theoretical $RDS_{ON}$ voltage drop, and the comparison of the third measured $RDS_{ON}$ voltage drop with the third theoretical $RDS_{ON}$ voltage drop. While this is done at the first temperature, the same process can be completed at the second temperature as well with a fourth measured $RDS_{ON}$ voltage drop and a fourth theoretical $RDS_{ON}$ voltage drop.

After the voltage correction function is fitted, method 600 further comprises storing the regression function in an on-chip memory of a driver chip for the MOS transistor switch (block 608).

The present methods can be implemented by computer executable instructions, such as program modules or components, which are executed by at least one processor. Generally, program modules include routines, programs, objects, data components, data structures, algorithms, and the like, which perform particular tasks or implemented particular abstract data types.

Instructions for carrying out the various process tasks, calculations, and generation of other data used in operation of the methods described herein can be implemented in software, firmware, or other computer- or processor-readable instructions. These instructions are typically stored on any appropriate computer program product that includes a computer readable medium used for storage of computer readable instructions or data structures. Such a computer readable medium can be any available media that can be accessed by a general purpose or special purpose computer or processor, or any programming logic device.

Example Embodiments

Example 1 includes a method for sensing a current, the method comprising: measuring an approximate temperature of a MOS transistor switch by a temperature sensor to yield a measured temperature; calculating a corrected temperature from the measured temperature using a stored temperature sensor gain and offset correction function; measuring a gate drive voltage for the MOS transistor; calculating a voltage correction factor using a stored voltage correction function, wherein the stored voltage correction function is a function of the corrected temperature and the gate drive voltage; measuring a $RDS_{ON}$ voltage drop across the MOS transistor switch to yield a measured $RDS_{ON}$ voltage drop; and calculating the current using the measured $RDS_{ON}$ voltage drop and the voltage correction factor.

Example 2 includes the method of Example 1, wherein calculating a corrected temperature from the measured temperature comprises multiplying the measured temperature by a temperature gain factor to yield a product and adding a temperature offset factor to the product to yield the corrected temperature, wherein the temperature gain factor and the temperature offset factor are determined using the stored temperature sensor gain and offset correction function and the measured temperature.

Example 3 includes the method of any of Examples 1-2, wherein calculating a corrected temperature from the measured temperature comprises adding a temperature offset factor to the measured temperature to yield a sum and multiplying the sum by a temperature gain factor to yield the corrected temperature, wherein the temperature gain factor and the temperature offset factor are determined using the stored temperature sensor gain and offset correction function and the measured temperature.

Example 4 includes the method of any of Examples 1-3, wherein the stored temperature sensor gain and offset correction function was determined using a regression fit function during a calibration process.

Example 5 includes the method of Example 4, wherein the regression fit function is a linear regression fit function.

Example 6 includes the method of any of Examples 1-5, wherein calculating the current comprises multiplying the measured $RDS_{ON}$ voltage drop by the voltage correction factor to yield a corrected $RDS_{ON}$ voltage drop and calculating the current from the corrected $RDS_{ON}$ voltage drop using Ohm's Law.

Example 7 includes the method of any of Examples 1-6, wherein the stored voltage correction function was determined using a regression fit function during a calibration process.

Example 8 includes the method of Example 7, wherein the regression fit function is a linear regression fit function.

Example 9 includes a method for determining a temperature sensor gain and offset correction function, the method comprising: comparing a first on-chip temperature sensor reading of a MOS transistor switch with a first off-chip temperature sensor reading of the MOS transistor switch at a first temperature; comparing a second on-chip temperature sensor reading of the MOS transistor switch with a second off-chip temperature sensor reading of the MOS transistor switch at a second temperature; fitting a regression function that corresponds to the temperature sensor gain and offset correction function using at least the comparison of the first on-chip temperature sensor reading with the first off-chip temperature sensor reading and at least the comparison of the second on-chip temperature sensor reading with the second off-chip temperature sensor reading; and storing the regression function in an on-chip memory of a driver chip for the MOS transistor switch.

Example 10 includes the method of Example 9, wherein the regression fit function is a linear regression function.

Example 11 includes a method for determining a voltage correction function, the method comprising: comparing a first measured $RDS_{ON}$ voltage drop across a MOS transistor switch when a calibrating current is passing through the MOS transistor switch with a first theoretical $RDS_{ON}$ voltage drop across the MOS transistor switch at a first temperature; comparing a second measured $RDS_{ON}$ voltage drop across the MOS transistor switch when a calibrating current is passing through the MOS transistor switch with a second theoretical $RDS_{ON}$ voltage drop across the MOS transistor switch at a second temperature; fitting a regression function that corresponds to the voltage correction function using at least the comparison of the first measured $RDS_{ON}$ voltage drop with the first theoretical $RDS_{ON}$ voltage drop and at least the comparison of the second measured $RDS_{ON}$ voltage drop with the second theoretical $RDS_{ON}$ voltage drop; and storing the regression fit function in an on-chip memory of a driver chip for the MOS transistor switch.

Example 12 includes the method of Example 11, wherein the regression fit function is a linear regression function.

Example 13 includes the method of any of Examples 11-12, further comprising: comparing a third measured $RDS_{ON}$ voltage drop across the MOS transistor switch when a calibrating current is passing through the MOS transistor switch with a third theoretical $RDS_{ON}$ voltage drop across the MOS transistor switch at the first temperature, wherein the third theoretical $RDS_{ON}$ voltage drop is different than the first theoretical $RDS_{ON}$ voltage drop; and wherein fitting the regression function uses at least the comparison of the first measured $RDS_{ON}$ voltage drop with the first theoretical $RDS_{ON}$ voltage drop, at least the comparison of the second measured $RDS_{ON}$ voltage drop with the second theoretical $RDS_{ON}$ voltage drop, and at least the comparison of the third measured $RDS_{ON}$ voltage drop with the third theoretical $RDS_{ON}$ voltage drop.

Example 14 includes the method of any of Examples 11-13, further comprising: comparing a fourth measured $RDS_{ON}$ voltage drop across the MOS transistor switch when a calibrating current is passing through the MOS transistor switch with a fourth theoretical $RDS_{ON}$ voltage drop across the MOS transistor switch at the second temperature, wherein the fourth theoretical $RDS_{ON}$ voltage drop is different than the second theoretical $RDS_{ON}$ voltage drop; and wherein fitting the regression function uses at least the comparison of the first measured $RDS_{ON}$ voltage drop with the first theoretical $RDS_{ON}$ voltage drop, at least the comparison of the second measured $RDS_{ON}$ voltage drop with the second theoretical $RDS_{ON}$ voltage drop, and at least the comparison of the fourth measured $RDS_{ON}$ voltage drop with the fourth theoretical $RDS_{ON}$ voltage drop.

Example 15 includes a current sensor comprising: a processing device; an on-chip temperature sensor, coupled to provide a measured temperature signal of a MOS transistor switch to the processing device; at least one circuit element coupled to the processing device and configured to: measure an $RDS_{ON}$ voltage drop across the MOS transistor switch to yield a measured $RDS_{ON}$ voltage drop, multiply the measured $RDS_{ON}$ voltage drop by a voltage correction factor, responsive to the processing device to yield a corrected $RDS_{ON}$ voltage drop and output the corrected $RDS_{ON}$ voltage drop; a memory device coupled to the processing device and configured to store a temperature sensor gain and offset correction function and a voltage correction function; and wherein the processing device is configured to: receive a gate drive voltage for the MOS transistor switch; receive the measured temperature signal and calculate a corrected temperature from the measured temperature signal using the stored temperature sensor gain and offset correction function; and instruct the at least one circuit element to multiply the measured $RDS_{ON}$ voltage drop by a voltage correction factor to yield the corrected $RDS_{ON}$ voltage drop, wherein the voltage correction factor is determined using the stored voltage correction function; and calculate a current from the corrected $RDS_{ON}$ voltage drop for use by the voltage regulator to regulate the voltage signal.

Example 16 includes the current sensor of Example 15, wherein the processing device is configured to calculate the corrected temperature from the measured temperature signal by multiplying the measured temperature signal by a temperature gain factor to yield a product and adding a temperature offset factor to the product to yield the corrected temperature, wherein the temperature gain factor is determined using the stored temperature sensor gain and offset correction function and the measured temperature.

Example 17 includes the current sensor of any of Examples 15-16, wherein the processing device is configured to calculate the corrected temperature from the measured temperature signal by adding a temperature offset factor to the measured temperature to yield a sum and multiplying the sum by a temperature gain factor to yield the corrected temperature, wherein the temperature gain factor and the temperature offset factor are determined using the stored temperature sensor gain and offset correction function and the measured temperature.

Example 18 includes the current sensor of any of Examples 15-17, wherein the at least one circuit element comprises single variable gain amplifier.

Example 19 includes the current sensor of any of Examples 15-18, wherein the at least one circuit element comprises: a gain amplifier coupled to the MOS transistor switch and configured to measure the $RDS_{ON}$ voltage drop across the MOS transistor switch; and an attenuating digital-to-analog converter coupled to the gain amplifier and the processing device, wherein the attenuating digital-to analog converter is configured to attenuate the output of the gain amplifier to yield the corrected $RDS_{ON}$ voltage drop, as instructed by the processing device.

Example 20 includes the current sensor of Example 19, further comprising a buffer, coupled to the attenuating digital-to-analog converter, and configured to buffer the corrected $RDS_{ON}$ voltage drop.

Example 21 includes the current sensor of any of Examples 15-20, wherein the current sensor is included in a voltage regulator.

Example 22 includes a system comprising: a power source configured to provide a voltage signal; a voltage regulator configured to regulate the voltage signal from the power source and produce an output voltage signal, wherein the voltage regulator includes a MOS transistor switch used in producing the output voltage signal, and wherein the voltage regulator includes a calibrated current sensor used to sense current though the MOS transistor switch; and a load coupled to the voltage regulator to receive the output voltage signal; wherein the calibrated current sensor comprises: a processing device; an on-chip temperature sensor, coupled to provide a measured temperature signal of a MOS transistor switch to the processing device; at least one circuit element coupled to the processing device and configured to: measure an $RDS_{ON}$ voltage drop across the MOS transistor switch to yield a measured $RDS_{ON}$ voltage drop, multiply the measured $RDS_{ON}$ voltage drop by a voltage correction factor according to the processing device's instructions to yield a corrected $RDS_{ON}$ voltage drop and output the corrected $RDS_{ON}$ voltage drop; a memory device coupled to the processing device and configured to store a temperature sensor gain and offset correction function and a voltage correction function; and wherein the processing device is configure to: receive a gate drive voltage for the MOS transistor switch; receive the measured temperature signal and calculate a corrected temperature from the measured temperature signal using the stored temperature sensor gain and offset correction function; instruct the at least one circuit element to multiply the measured $RDS_{ON}$ voltage drop by a voltage correction factor to yield the corrected $RDS_{ON}$ voltage drop, wherein the voltage correction factor is determined using the stored voltage correction function; and calculate the current from the corrected $RDS_{ON}$ voltage drop for use by the voltage regulator to regulate the voltage signal.

Example 23 includes the system of Example 22, wherein the processing device is configured to calculate the corrected temperature from the measured temperature signal by multiplying the measured temperature signal by a temperature gain factor and adding a temperature offset factor to yield a corrected temperature, wherein the temperature gain factor is determined using the stored temperature sensor gain and offset correction function and the measured temperature.

Example 24 includes the system of any of Examples 22-23, wherein the at least one circuit element comprises single variable gain amplifier.

Example 25 includes the system of any of Examples 22-24, wherein the at least one circuit element comprises: a gain amplifier coupled to the MOS transistor switch and configured to measure the $RDS_{ON}$ voltage drop across the MOS transistor switch; and an attenuating digital-to-analog converter coupled to the gain amplifier and the processing device, wherein the attenuating digital-to analog converter is configured to attenuate the output of the gain amplifier to yield the corrected $RDS_{ON}$ voltage drop, as instructed by the processing device.

Example 26 includes the system of Example 25, further comprising a buffer coupled to the attenuating digital-to-analog converter, and configured to buffer the corrected $RDS_{ON}$ voltage drop.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. A method for sensing a current, the method comprising:
   measuring an approximate temperature of a MOS transistor switch by a temperature sensor to yield a measured temperature;
   calculating a corrected temperature from the measured temperature using a stored temperature sensor gain and offset correction function;
   measuring a gate drive voltage for the MOS transistor;
   calculating a voltage correction factor using a stored voltage correction function, wherein the stored voltage correction function is a function of the corrected temperature and the gate drive voltage;
   measuring a $RDS_{ON}$ voltage drop across the MOS transistor switch to yield a measured $RDS_{ON}$ voltage drop; and
   calculating the current using the measured $RDS_{ON}$ voltage drop and the voltage correction factor.

2. The method of claim 1, wherein calculating a corrected temperature from the measured temperature comprises multiplying the measured temperature by a temperature gain factor to yield a product and adding a temperature offset factor to the product to yield the corrected temperature, wherein the temperature gain factor and the temperature offset factor are determined using the stored temperature sensor gain and offset correction function and the measured temperature.

3. The method of claim 1, wherein calculating a corrected temperature from the measured temperature comprises adding a temperature offset factor to the measured temperature to yield a sum and multiplying the sum by a temperature gain factor to yield the corrected temperature, wherein the temperature gain factor and the temperature offset factor are determined using the stored temperature sensor gain and offset correction function and the measured temperature.

4. The method of claim 1, wherein the stored temperature sensor gain and offset correction function was determined using a regression fit function during a calibration process.

5. The method of claim 4, wherein the regression fit function is a linear regression fit function.

6. The method of claim 1, wherein calculating the current comprises multiplying the measured $RDS_{ON}$ voltage drop by the voltage correction factor to yield a corrected $RDS_{ON}$ voltage drop and calculating the current from the corrected $RDS_{ON}$ voltage drop using Ohm's Law.

7. The method of claim 1, wherein the stored voltage correction function was determined using a regression fit function during a calibration process.

8. The method of claim 7, wherein the regression fit function is a linear regression fit function.

9. A current sensor comprising:
a processing device;
an on-chip temperature sensor, coupled to provide a measured temperature signal of a MOS transistor switch to the processing device;
at least one circuit element coupled to the processing device and configured to: measure an $RDS_{ON}$ voltage drop across the MOS transistor switch to yield a measured $RDS_{ON}$ voltage drop, multiply the measured $RDS_{ON}$ voltage drop by a voltage correction factor, responsive to the processing device to yield a corrected $RDS_{ON}$ voltage drop and output the corrected $RDS_{ON}$ voltage drop;
a memory device coupled to the processing device and configured to store a temperature sensor gain and offset correction function and a voltage correction function; and
wherein the processing device is configured to:
receive a gate drive voltage for the MOS transistor switch;
receive the measured temperature signal and calculate a corrected temperature from the measured temperature signal using the stored temperature sensor gain and offset correction function; and
instruct the at least one circuit element to multiply the measured $RDS_{ON}$ voltage drop by a voltage correction factor to yield the corrected $RDS_{ON}$ voltage drop, wherein the voltage correction factor is determined using the stored voltage correction function; and
calculate a current from the corrected $RDS_{ON}$ voltage drop for use by the voltage regulator to regulate the voltage signal.

10. The current sensor of claim 9, wherein the processing device is configured to calculate the corrected temperature from the measured temperature signal by multiplying the measured temperature signal by a temperature gain factor to yield a product and adding a temperature offset factor to the product to yield the corrected temperature, wherein the temperature gain factor is determined using the stored temperature sensor gain and offset correction function and the measured temperature.

11. The current sensor of claim 9, wherein the processing device is configured to calculate the corrected temperature from the measured temperature signal by adding a temperature offset factor to the measured temperature to yield a sum and multiplying the sum by a temperature gain factor to yield the corrected temperature, wherein the temperature gain factor and the temperature offset factor are determined using the stored temperature sensor gain and offset correction function and the measured temperature.

12. The current sensor of claim 9, wherein the at least one circuit element comprises single variable gain amplifier.

13. The current sensor of claim 9, wherein the at least one circuit element comprises:
a gain amplifier coupled to the MOS transistor switch and configured to measure the $RDS_{ON}$ voltage drop across the MOS transistor switch; and
an attenuating digital-to-analog converter coupled to the gain amplifier and the processing device, wherein the attenuating digital-to analog converter is configured to attenuate the output of the gain amplifier to yield the corrected $RDS_{ON}$ voltage drop, as instructed by the processing device.

14. The current sensor of claim 13, further comprising a buffer, coupled to the attenuating digital-to-analog converter, and configured to buffer the corrected $RDS_{ON}$ voltage drop.

15. The current sensor of claim 9, wherein the current sensor is included in a voltage regulator.

16. A system comprising:
a power source configured to provide a voltage signal;
a voltage regulator configured to regulate the voltage signal from the power source and produce an output voltage signal, wherein the voltage regulator includes a MOS transistor switch used in producing the output voltage signal, and wherein the voltage regulator includes a calibrated current sensor used to sense current though the MOS transistor switch; and
a load coupled to the voltage regulator to receive the output voltage signal;
wherein the calibrated current sensor comprises:
a processing device;
an on-chip temperature sensor, coupled to provide a measured temperature signal of a MOS transistor switch to the processing device;
at least one circuit element coupled to the processing device and configured to: measure an $RDS_{ON}$ voltage drop across the MOS transistor switch to yield a measured $RDS_{ON}$ voltage drop, multiply the measured $RDS_{ON}$ voltage drop by a voltage correction factor according to the processing device's instructions to yield a corrected $RDS_{ON}$ voltage drop and output the corrected $RDS_{ON}$ voltage drop;
a memory device coupled to the processing device and configured to store a temperature sensor gain and offset correction function and a voltage correction function; and
wherein the processing device is configure to:
receive a gate drive voltage for the MOS transistor switch;
receive the measured temperature signal and calculate a corrected temperature from the measured temperature signal using the stored temperature sensor gain and offset correction function;
instruct the at least one circuit element to multiply the measured $RDS_{ON}$ voltage drop by a voltage correction factor to yield the corrected $RDS_{ON}$ voltage drop, wherein the voltage correction factor is determined using the stored voltage correction function; and
calculate the current from the corrected $RDS_{ON}$ voltage drop for use by the voltage regulator to regulate the voltage signal.

17. The system of claim 16, wherein the processing device is configured to calculate the corrected temperature from the measured temperature signal by multiplying the measured temperature signal by a temperature gain factor and adding a temperature offset factor to yield a corrected temperature, wherein the temperature gain factor is determined using the stored temperature sensor gain and offset correction function and the measured temperature.

18. The system of claim 16, wherein the at least one circuit element comprises single variable gain amplifier.

19. The system of claim 16, wherein the at least one circuit element comprises:

a gain amplifier coupled to the MOS transistor switch and configured to measure the $RDS_{ON}$ voltage drop across the MOS transistor switch; and an attenuating digital-to-analog converter coupled to the gain amplifier and the processing device, wherein the attenuating digital-to analog converter is configured to attenuate the output of the gain amplifier to yield the corrected $RDS_{ON}$ voltage drop, as instructed by the processing device.

20. The system of claim 19, further comprising a buffer coupled to the attenuating digital-to-analog converter, and configured to buffer the corrected $RDS_{ON}$ voltage drop.

* * * * *